(12) United States Patent
Rieutord et al.

(10) Patent No.: US 12,002,697 B2
(45) Date of Patent: Jun. 4, 2024

(54) METHOD FOR DETECTING THE SPLITTING OF A SUBSTRATE WEAKENED BY IMPLANTING ATOMIC SPECIES

(71) Applicants: Soitec, Bernin (FR); Commissariat A L'Energie Atomique et aux Énergies Alternatives, Paris (FR)

(72) Inventors: François Rieutord, Saint Egreve (FR); Frédéric Mazen, Saint Egreve (FR); Didier Landru, Le Champ-près-Froges (FR); Oleg Kononchuk, Theys (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 406 days.

(21) Appl. No.: 17/042,755

(22) PCT Filed: Mar. 22, 2019

(86) PCT No.: PCT/FR2019/050659
§ 371 (c)(1),
(2) Date: Sep. 28, 2020

(87) PCT Pub. No.: WO2019/186037
PCT Pub. Date: Oct. 3, 2019

(65) Prior Publication Data
US 2021/0028036 A1    Jan. 28, 2021

(30) Foreign Application Priority Data
Mar. 28, 2018    (FR) ........................................ 1852683

(51) Int. Cl.
*H01L 21/67*    (2006.01)
*G01N 29/14*    (2006.01)
(Continued)

(52) U.S. Cl.
CPC ....... *H01L 21/67288* (2013.01); *G01N 29/14* (2013.01); *G01N 29/46* (2013.01);
(Continued)

(58) Field of Classification Search
CPC ......... H01L 21/67288; H01L 21/67109; H01L 22/12; H01L 22/20; H01L 21/76254;
(Continued)

(56) References Cited

U.S. PATENT DOCUMENTS 5,374,564 A    12/1994  Bruel
2007/0204672 A1*    9/2007  Huang .................. G01P 15/008
                                                                73/1.88
(Continued)

FOREIGN PATENT DOCUMENTS

FR    2681472 B1    10/1993
FR    2902926 B1    10/2008
(Continued)

OTHER PUBLICATIONS

International Search Report for International Application No. PCT/FR2019/050659 dated Jun. 13, 2019, 3 pages.
(Continued)

*Primary Examiner* — Tarun Sinha
(74) *Attorney, Agent, or Firm* — TraskBritt

(57) ABSTRACT

A method for monitoring a heat treatment applied to a substrate comprising a weakened zone formed by implanting atomic species for splitting the substrate along the weakened zone, the substrate being arranged in a heating chamber, the method comprising recording sound in the interior or in the vicinity of the heating chamber and detecting, in the recording, a sound emitted by the substrate during the splitting thereof along the weakened zone. A device for the heat treatment of a batch of substrates comprises an annealing furnace comprising a heating chamber intended to receive
(Continued)

the batch, at least one microphone configured to record sounds in the interior or in the vicinity of the heating chamber, and a processing system configured to detect, in an audio recording produced by the microphone, a sound emitted when a substrate splits.

20 Claims, 3 Drawing Sheets

(51) Int. Cl.
  *G01N 29/46* (2006.01)
  *H01L 21/66* (2006.01)
(52) U.S. Cl.
  CPC ........ *H01L 21/67109* (2013.01); *H01L 22/12* (2013.01); *G01N 2291/2697* (2013.01)
(58) Field of Classification Search
  CPC .. H01L 21/67754; G01N 29/14; G01N 29/46; G01N 2291/2697
  See application file for complete search history.

(56) References Cited

U.S. PATENT DOCUMENTS

| | | | |
|---|---|---|---|
| 2010/0015733 A1 | 1/2010 | Sanchez | |
| 2010/0039128 A1* | 2/2010 | Nitsch | H01L 22/12 324/762.05 |
| 2011/0016975 A1* | 1/2011 | Glaesemann | G01N 29/2437 73/588 |
| 2012/0241918 A1* | 9/2012 | Boulet | H01L 31/1848 257/E29.024 |
| 2013/0213137 A1 | 8/2013 | Ostapenko | |
| 2015/0303098 A1* | 10/2015 | Landru | H01L 21/6835 438/458 |

FOREIGN PATENT DOCUMENTS

| | | | |
|---|---|---|---|
| JP | 03-069133 A | | 8/1989 |
| JP | 1997-243702 A | | 9/1997 |
| JP | 2000294754 A | * | 10/2000 |
| JP | 2009-23697 A | | 10/2009 |
| JP | 2009231697 A | * | 10/2009 |
| JP | 2009-283582 A | | 12/2009 |
| JP | 2011-007750 A | | 1/2011 |
| TW | 201734445 A | | 10/2017 |

OTHER PUBLICATIONS

International Written Opinion for International Application No. PCT/2019/050659 dated Jun. 13, 2019, 10 pages.
Singapore Search Report for Singapore Application No. 11202009544X dated Nov. 24, 2021, 8 pages.
Taiwanese Office Action and Search Report for Application No. 11121152050 dated Nov. 23, 2022, 7 pages.
Japanese Notice of Reasons for Refusal for Application No. 2020-551816 dated Mar. 24, 2023, 5 pages.

* cited by examiner

METHOD FOR DETECTING THE SPLITTING OF A SUBSTRATE WEAKENED BY IMPLANTING ATOMIC SPECIES

CROSS-REFERENCE TO RELATED APPLICATIONS

This application is a national phase entry under 35 U.S.C. § 371 of International Patent Application PCT/FR2019/050659, filed Mar. 22, 2019, designating the United States of America and published in French as International Patent Publication WO 2019/186037 A1 on Oct. 3, 2019, which claims the benefit under Article 8 of the Patent Cooperation Treaty to French Patent Application Serial No. 1852683, filed Mar. 28, 2018.

TECHNICAL FIELD

The present disclosure relates to the detection of the splitting of a substrate weakened beforehand by implanting atomic species, and its application to the monitoring of a heat treatment applied to the substrate in order to cause the splitting.

BACKGROUND

The SMART CUT® process allows a layer to be transferred from a first substrate, called the donor substrate to a second substrate, called the receiver substrate.

To this end, the process comprises a step of implanting atomic species into the donor substrate, so as to form therein a weakened zone located at a depth corresponding to the thickness of the layer to be transferred. Atomic species are typically hydrogen and/or helium. In the weakened zone, the implanted species create defects that are referred to as "microcracks," which take the form of cavities lying in a plane parallel to the main surface of the donor substrate.

The donor substrate is then bonded to the receiver substrate.

A thermal splitting step is then implemented, in which step, the wafer resulting from the bonding of the donor substrate and receiver substrate is raised to a temperature that is sufficiently high to allow the microcracks to develop. To this end, the wafer is placed in an annealing furnace, the temperature of which is controlled. The anneal causes an increase in the pressure in the cavities, until the donor substrate splits along the weakened zone. Once splitting has been initiated in one region of the weakened zone, the split propagates almost instantaneously along the zone. For example, the time taken for the splitting to occur is about 100 µs for a substrate of 300 mm diameter.

After splitting, the two portions of the wafer remain in contact with each other on either side of the splitting plane.

The wafer is unloaded from the annealing furnace with a view to separating the two portions of the wafer. The separation is, for example, achieved by inserting a blade between the two portions.

Generally, this process is implemented in batches, each batch comprising a plurality of wafers that are placed together in the annealing furnace.

Detection of splitting is an important parameter in the layer-transfer process.

Specifically, it is generally sought to minimize the thermal budget of the anneal by stopping the anneal once all of the wafers of the batch have been split, in order to avoid damaging the wafers with an excessively high thermal budget, and to optimize the efficiency of the annealing furnace.

Moreover, it is possible, even if the intended thermal budget is applied, for one or more wafers of a given batch not to split. Such a situation may disrupt the realization of the separating step, which is generally automated, causing blockage of the separating machine. It is, therefore, desirable to be able to detect if a wafer has not been split, in order to be able to isolate the fabrication batch in question with a view to processing it manually and preventing the rest of the process from being disrupted.

To this end, document FR 2 902 926 proposes equipping the holder that holds the wafer in the annealing furnace with a piezoelectric sensor. During splitting, the vibration caused within the wafer is transmitted to the piezoelectric sensor and converted into an electrical signal that is recorded by a controller of the annealing furnace. Processing of this signal allows peaks that are characteristic of splitting to be detected.

However, use of such a piezoelectric sensor causes a certain number of problems.

On the one hand, it is indispensable to have a mechanical link between the wafer and the sensor for the latter to be able to detect splitting. However, depending on the type of equipment employed, it may be difficult to ensure such a mechanical link. Specifically, in certain furnaces, the cassettes containing the substrates are placed in direct contact with the wall of the furnace, which may transmit vibrations generated by splitting but also by shocks related to the surrounding environment. These configurations are, therefore, unfavorable to the detection of splitting because they do not have a holder suitable for the piezoelectric sensors. Furthermore, the sensor generally cannot be placed directly in the furnace itself in contact with the cassettes or substrates because of limitations regarding the temperature that it is able to withstand and contamination that it is liable to generate on the substrates.

Furthermore, a wafer may break or be damaged during splitting, this being liable to disrupt the separation. As in the case where splitting does not occur, it is necessary to isolate the batch in question in order to process it manually. However, a piezoelectric sensor is not suitable for detecting such an event. Specifically, the shock induced by breakage of a substrate depends on the size of the pieces and how they drop onto the holder, which are random factors.

Lastly, it has been shown that the characteristics of the substrate after splitting (in particular, its roughness) largely depend on the mechanical energy released during splitting. It would, therefore, be advantageous to be able to evaluate this quantity.

However, the signal delivered by the piezoelectric sensor does not easily allow the splitting characteristics, for example, splitting energy or duration, to be determined.

At the present time, this energy is determined very indirectly by attempting to correlate the characteristics of the split surface with an energy. This is, however, a complex task, because it depends on the substrate and many parameters that are not necessarily controlled or known.

A more direct way of estimating the energy released during splitting is to measure the time at which splitting occurs using a piezoelectric sensor such as the aforementioned. It is assumed that the energy released only depends on the thermal budget received by the wafer. However, this assumption is true only to a first approximation. Specifically, wafers may split at the same time but on so doing release different amounts of energy because of differing initiation mechanisms.

BRIEF SUMMARY

One aim of the present disclosure is to remedy the problems mentioned and to provide a method allowing the time at which splitting of a substrate occurs to be detected with precision, and for this to be done for each substrate of a batch present in an annealing furnace.

This method must also make it possible to detect whether a substrate of the batch has not split or whether a substrate has broken during splitting.

To this end, the disclosure provides a method for monitoring a heat treatment applied to a substrate comprising a weakened zone formed by implanting atomic species with a view to splitting the substrate along the weakened zone, the substrate being arranged in a heating chamber, characterized in that it comprises recording sound in the interior or in the vicinity of the heating chamber and detecting, in the recording, a sound emitted by the substrate during the splitting thereof along its weakened zone.

By "vicinity of the heating chamber" is meant a zone that is sufficiently close to the chamber so that the sound emitted during the splitting can be recorded. The size and location of the zone may depend on the environment of the furnace, but the skilled person is able, based on a few audio recordings made previously, to make sure that at the intended location the audio recording is of sufficiently good quality so that the sound of the fracture may be detected therein.

The advantage of this audio recording is that the sound emitted by the substrate during the splitting thereof is very specific and cannot be confused with the sound produced during another event in the environment of the annealing furnace.

Moreover, apart from simple determination of the time at which splitting occurred, the recorded sound lends itself to an analysis (for example, frequency spectrum, duration, intensity, etc.) that allows quantities characteristic of the splitting, for example, the energy released, splitting speed, the occurrence of a breakage, etc. to be determined.

According to a first embodiment, the recording is made with a microphone arranged in the interior of the heating chamber.

According to a second embodiment, the recording is made with a microphone arranged on an exterior wall of an annealing furnace containing the heating chamber.

According to a third embodiment, the recording is made with a microphone arranged between a thermal screen and a door of an annealing furnace allowing access to the heating chamber.

According to a fourth embodiment, the recording is made with a microphone arranged in a tube that opens onto the interior of the heating chamber.

Advantageously, the method further comprises, from the recording of the sound in the interior or in the vicinity of the heating chamber, detecting a breakage of the substrate.

In one application of the method, a batch of substrates to be split is loaded into the heating chamber, the method comprising detecting, in the audio recording, the sound emitted by each substrate during the splitting thereof.

According to one form of execution, the method comprises recording sound in the interior or in the vicinity of the heating chamber using two microphones that are located at a distance from each other, and, on the basis of a time shift between the sounds of the splitting of a substrate detected in the recording of each of the microphones, locating within the batch the substrate for which splitting has occurred.

Preferably, the microphones are arranged in opposite regions of the heating chamber.

Advantageously, the heat treatment is stopped once each substrate of the batch has been detected to have split.

If, after a preset length of time, the number of substrates detected to have split is lower than the number of substrates, the batch is unloaded with a view to separating the split substrates manually.

Advantageously, a vibration frequency of a substrate during splitting is determined from a maximum frequency of the sound generated by the splitting of the substrate, and a splitting speed of the substrate is determined from the vibration frequency.

Moreover, an energy released during the splitting of a substrate may be determined from the intensity of the sound generated by the splitting.

It is also possible to determine the speed of a splitting wave propagating through a substrate from the maximum frequency corresponding to the peak sound intensity.

Preferably, the substrate comprises at least one semiconductor material.

Another subject of the present disclosure relates to a device for the heat treatment of a batch of substrates to be split.

The device comprises an annealing furnace comprising a heating chamber intended to simultaneously receive the whole of the batch, at least one microphone configured to record sounds in the interior or in the vicinity of the heating chamber, and a processing system configured to detect, in an audio recording produced by the microphone, a sound emitted when a substrate splits.

According to one embodiment, the microphone is arranged in a tube that opens onto the interior of the heating chamber.

Particularly advantageously, the device comprises at least two microphones that are located at a distance from one another.

According to one form of execution, the processing system is configured, on the basis of a time shift between the sounds of the splitting of a substrate detected in the recording of each of the microphones, to locate within the batch the substrate for which splitting has occurred.

Advantageously, the device further comprises a system for controlling the furnace, configured to stop the heat treatment once all the substrates of the batch have been detected to have split.

BRIEF DESCRIPTION OF THE DRAWINGS

Other features and advantages of the disclosure will emerge from the detailed description that follows, with reference to the accompanying drawings in which.

DETAILED DESCRIPTION

The present disclosure is based on the fact that the splitting of a substrate, in particular, a semiconductor substrate, along a weakened zone formed beforehand by implanting atomic species has a specific acoustic signature, which may, therefore, be detected within an audio recording in or in the vicinity of the heat-treatment furnace in which the substrate is located. The substrate may be alone or bonded to another substrate. The latter case, in particular, applies when it is desired to transfer a layer of the substrate to the other substrate via the SMART CUT® process.

Figure 1:
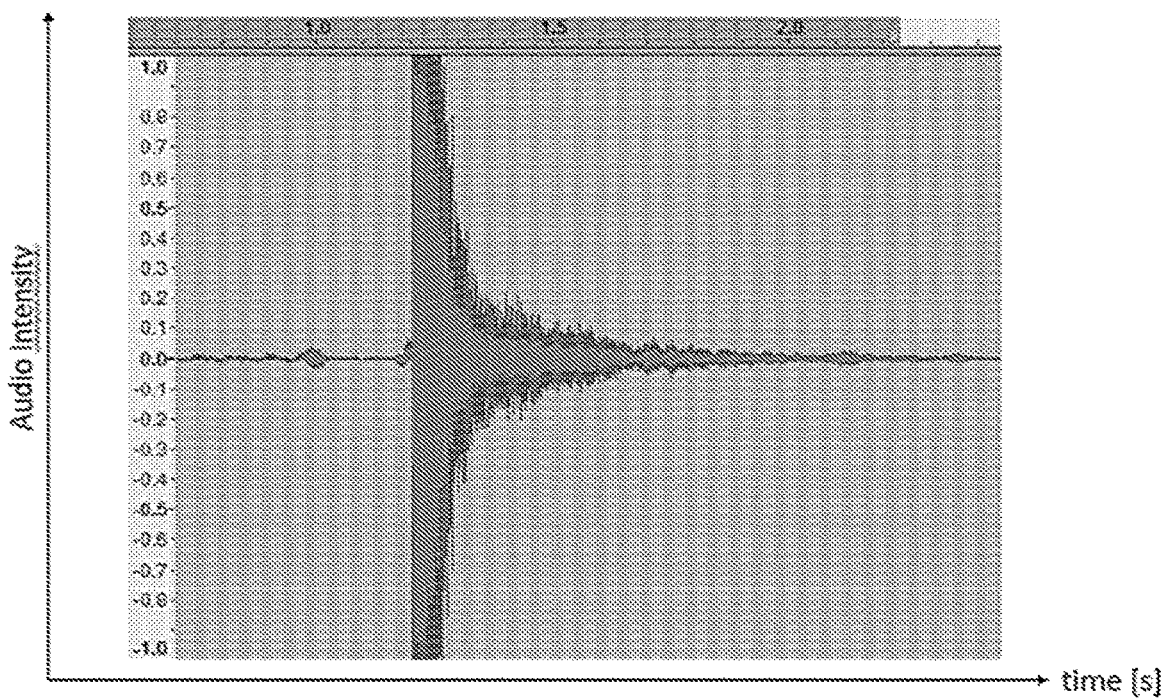
FIG. 1 is a representation of the acoustic signature of the splitting of a silicon substrate.

FIG. 1 illustrates the acoustic signature of the splitting of a silicon substrate, i.e., the audio intensity as a function of time detected in the annealing furnace 1 following the splitting of the substrate. The unit of the time axis is seconds. This signature takes the form of an abrupt increase in sound intensity then a rapid exponential decrease over a time of 1 to 2 s.

Such a signature is specific to splitting, and cannot be confused with the signature of other events liable to occur in or in the vicinity of the annealing furnace 1.

This signature may be obtained with any microphone sensitive to frequencies of a few tens of kHz, optionally suitable for operating at high temperature depending on its intended location.

The detection of the splitting delivers at least one piece of information on the splitting process that is qualitative (splitting or not of a substrate) or even quantitative as will be explained in more detail below.

Thus, this disclosure has gone against the teaching of document FR 2 902 926 according to which, an audio recording is not suitable for detecting the splitting of a substrate, and has, in contrast, demonstrated that it is possible to extract from an audio spectrum more information than from the signal of a piezoelectric sensor in contact with the substrate.

In particular, surprisingly, even though the splitting is almost instantaneous (of about 100 μs), the sound caused by the splitting has a much longer duration, of about 1 to 2 s. This effect seems to be explained by an induced oscillation of the substrate on either side of the splitting plane, under the effect of a difference between the pressure generated within the microcracks and the gas pressure surrounding the substrate.

Although the audio spectrum is relatively complex (composed of several frequencies), it has a signature that is characteristic of splitting and that may be detected by processing the signal.

FIGS. 2 to 6 illustrate various embodiments of the disclosure.

In each of these figures, the structure of the furnace is identical and will, therefore, be described only once here. If a given reference sign is used in more than one figure, it means that the elements referred to are identical or perform the same function. To make the figures clearer, the various elements are not necessarily shown to scale.

The furnace 1 has a tubular general shape that extends along a horizontal axis. The interior wall 10 of the furnace defines a heating chamber 11 in which the substrates S to be split are placed. In general, the heat treatment is not carried out on a single substrate but on a batch of substrates. To this end, the substrates are arranged in vertical position in one or more cassettes 2 that are placed side-by-side in the furnace. The cassettes are introduced via a door 12 that is located at one end of the tube. The door 12 is thermally insulated from the heating chamber 11 by a thermal screen 13. The end of the tube opposite to the door is usually blind. Heating elements 14 are arranged around the wall of the furnace in order to raise the heating chamber to the temperature desired for the splitting. For example, the temperature applied to split silicon substrates is generally about from 100 to 500° C., preferably from 300 to 500° C.

Those skilled in the art will naturally be able to adapt the teaching provided below to any other type of furnace.

The star surrounded by circles symbolizes the occurrence of splitting in a substrate and the propagation of sound that results therefrom.

Whatever the location of the microphone, the latter transmits data recorded in real time to a control station comprising a computer (designated by the reference 4 in FIG. 6) allowing the recordings to be processed by implementation of a suitable software package for processing the signal. The data may be transmitted by wire or wirelessly, using any suitable protocol.

The control station is advantageously configured, depending on the results of the processing of the data, to trigger stoppage of the furnace, or to generate a warning for the attention of an operator tasked with monitoring the furnace.

Figure 2:
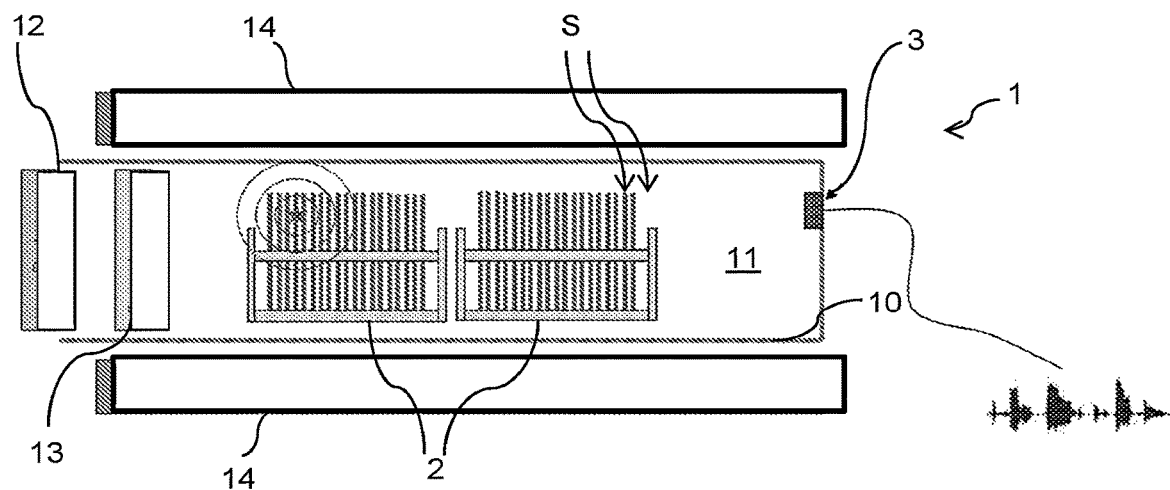
FIG. 2 is a schematic of installation of a microphone according to a first embodiment in the interior of the annealing furnace.

FIG. 2 illustrates a first embodiment, in which a microphone 3 is arranged directly in the heating chamber 11. For this application, a microphone suitable for high temperatures, i.e., tolerating temperatures of as high as 300° C., or even 850° C., which type of microphone is commercially available, is chosen. Thus, the microphone is as close as possible to the substrates and is less sensitive to noises made outside of the furnace.

Advantageously, the microphone is placed on the wall opposite the door 12.

Figure 3:
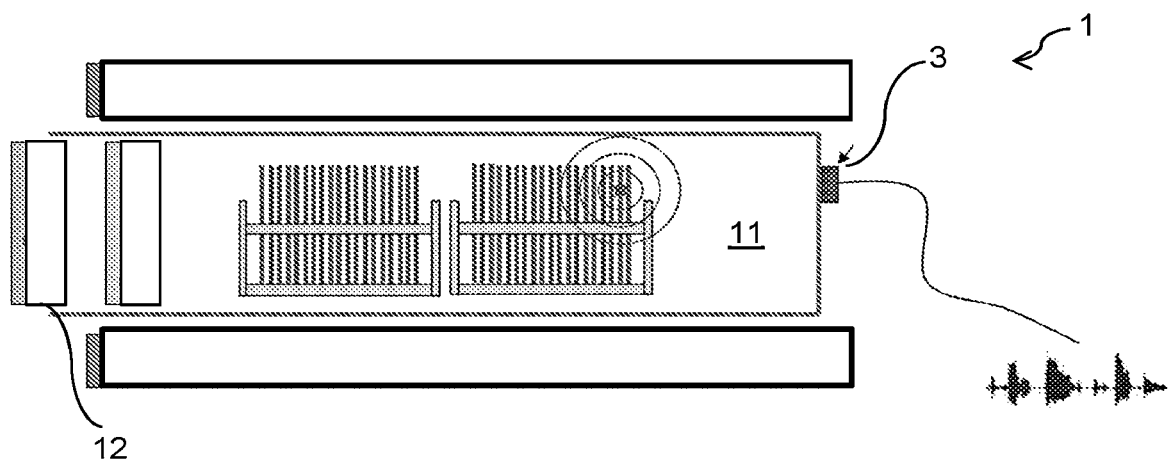
FIG. 3 is a schematic of installation of a microphone according to a second embodiment on the exterior wall of the annealing furnace.

FIG. 3 illustrates a second embodiment in which a microphone 3 is arranged on an exterior wall of the furnace, for example, opposite the door 12. The audio detection is less effective but sufficient for the detection of the splitting of a substrate. Moreover, this variant of execution makes it possible to not require a microphone suitable for high temperatures.

Figure 4:
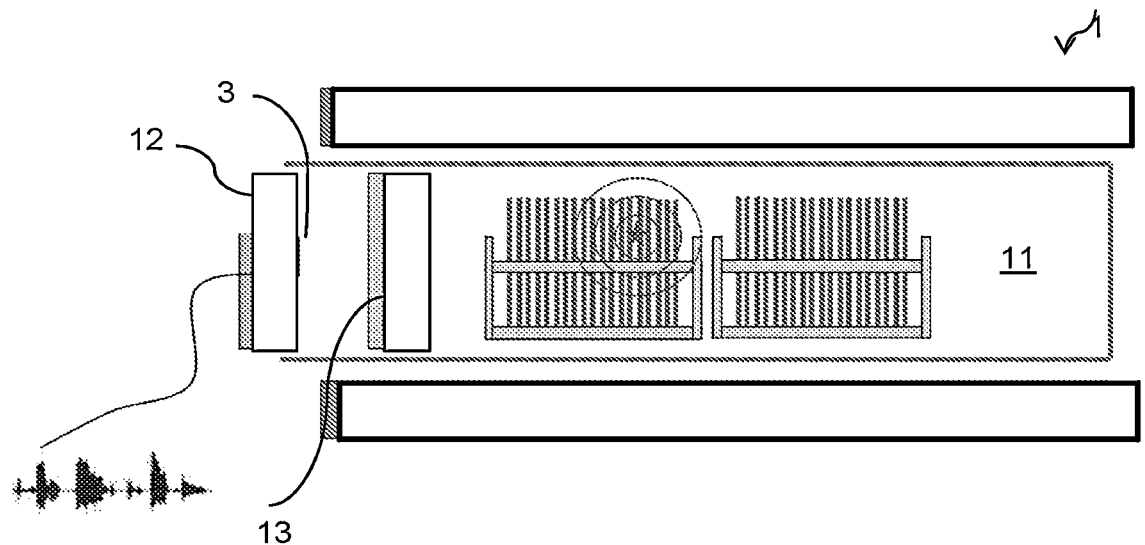
FIG. 4 is a schematic of installation of a microphone according to a third embodiment between the door and the thermal screen of the annealing furnace.

FIG. 4 illustrates a third embodiment, in which the microphone 3 is arranged between the door 12 and the thermal screen 13 of the furnace. With respect to the first embodiment the microphone is subjected to lower temperatures, but it is naturally necessary to choose one suitable for these temperatures.

Figure 5:
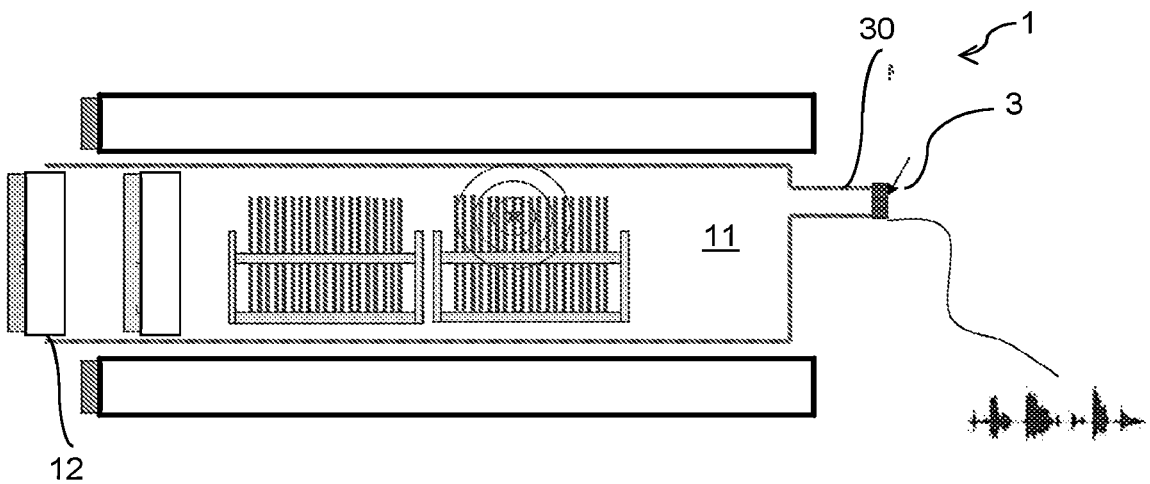
FIG. 5 is a schematic of installation of a microphone according to a fourth embodiment, in a tube in fluidic connection with the interior of the annealing furnace.

FIG. 5 illustrates a fifth embodiment, comprising a particular mount for the microphone 3. This mount comprises a tube 30 of small diameter, substantially corresponding to the size of the microphone 3, and, for example, of about 1 to 5 mm. The length of the tube is typically about 1 to 10 cm. The tube 30 opens onto the heating chamber 11 through a hole drilled in the wall of the furnace, for example, the wall opposite the door 12. Thus, even if the microphone makes contact with the atmosphere of the furnace, the thermal dissipation that occurs along the tube is sufficient to guarantee a temperature compatible with the operation of the microphone, even if the latter is not especially suitable for high temperatures.

Figure 6:
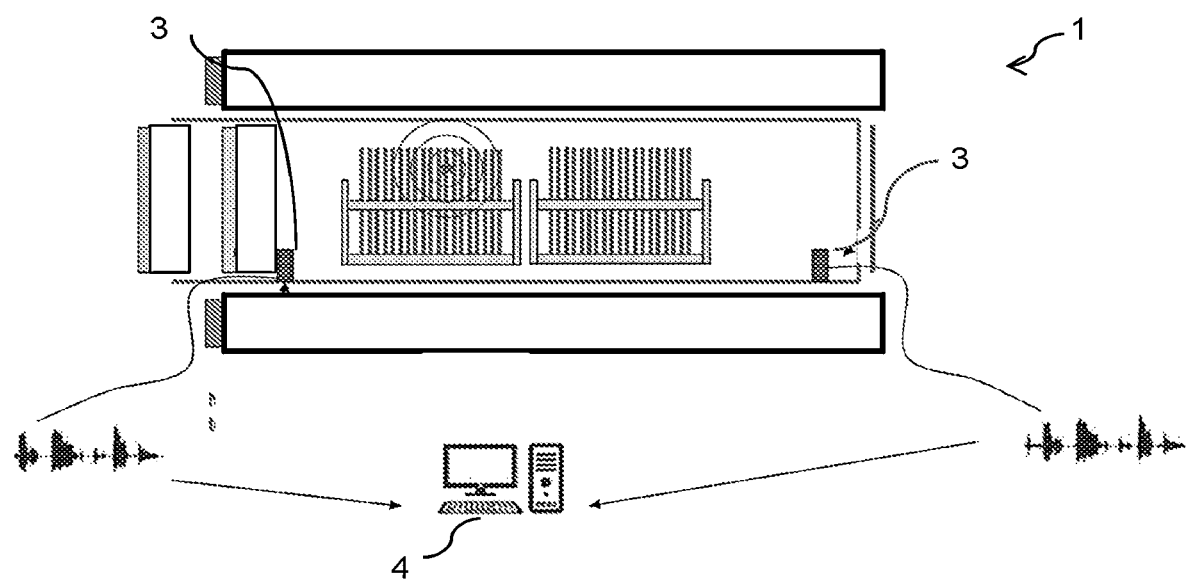
FIG. 6 is a schematic of installation of two microphones according to a fifth embodiment, in two opposite locations in the annealing furnace.

FIG. 6 illustrates a fifth embodiment, in which two microphones 3 are arranged in the furnace, each in the vicinity of one end of the tube. Each microphone records the sounds that are produced within the heating chamber 11. During the processing of the recordings transmitted by each microphone, the time shift of the acoustic signatures of a given event allows the location, within the batch, of the substrate in which splitting took place to be estimated. It is thus possible to determine the substrate that has split.

Naturally, the various embodiments described above may be combined.

The exploitation of the detection of the splitting of a substrate may take various forms.

On the one hand, counting the number of substrates detected to have split and comparing this number with the number of substrates present in the furnace makes it possible to verify whether each substrate has indeed split. In this case, it may be advantageous to trigger stoppage of the heat treatment once the number of substrates detected to have split reaches the number of substrates, since the heat treatment then becomes pointless. It is thus possible to optimize cycle time, minimize the thermal budget applied to the substrates and decrease power consumption.

In contrast, if at the end of a preset duration of heat treatment, the number of substrates detected to have split is lower than the number of substrates, it is possible to deduce that one or more substrates have not split. In such a case, it is preferable to not send this batch to an automated separating machine, because the presence of an un-split substrate will possibly cause untimely stoppage of the machine. The batch in question is, therefore, unloaded with a view to separating the split substrates manually.

Breakage of a substrate does not necessarily result in a specific signature. Specifically, the sound produced during a breakage may be related to how the pieces of the substrate fall or indeed to how the substrate breaks and may, therefore, have variable characteristics. However, insofar as the sound produced by the splitting of a substrate is well identified, any other sound produced in the chamber may be related to a breakage. In this case, it is advantageous to take the batch out of the furnace with a view to processing it manually, in order to prevent a broken substrate from disrupting the operation of the automatic separating machine. Advantageously, the interior of the furnace is cleaned before a new batch of substrates to be split is introduced.

Figure 7:
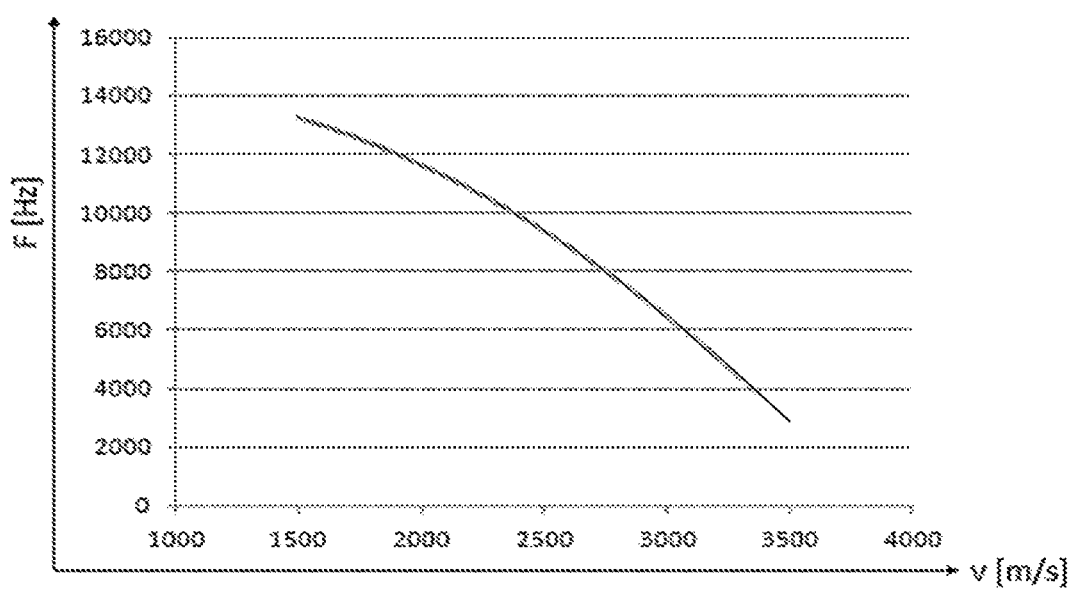
FIG. 7 is a calibration curve showing the relationship between the frequency of the vibrations emitted during splitting (in Hz) and the speed of the splitting (in m/s).

Moreover, apart from the qualitative exploitation that has just been described, this disclosure has demonstrated a correlation between the maximum audio frequency corresponding to the peak intensity and the speed of the splitting wave that propagates through the substrate. This correlation is schematically shown in FIG. 7, which shows the relationship between the frequency of the emitted vibrations (in Hz) and the speed of the splitting wave (in m/s). By virtue of such a curve, which is constructed beforehand for a given type of substrate and determined implantation conditions, it is possible to determine, from the audio recording of each substrate, the speed of the corresponding splitting. It is then possible to verify the uniformity of the splitting characteristics within the batch.

Moreover, the energy released during splitting is directly proportional to the detected maximum sound intensity. Therefore, the relative variation in the maximum sound intensity and its comparison to the average value detected on identical substrates allows the energy released during the splitting of a substrate, which is an indicator of the quality of the splitting, to be estimated.

The invention claimed is:

1. A method for monitoring a heat treatment applied to a batch of substrates in a heating chamber, each substrate comprising a weakened zone formed by implanting atomic species for splitting the substrate along the weakened zone, the method comprising:
   recording sound in the interior or in the vicinity of the heating chamber;
   detecting, in the recording, an acoustic signature emitted by each substrate during the splitting thereof along the weakened zone;
   determining, based on the detected acoustic signature, that a splitting of each substrate along the weakened zone has occurred;
   determining a number of substrates having split;
   comparing the number of substrates having split to the number of substrates in the batch; and
   stopping the heat treatment once each substrate has been detected to have split.

2. The method of claim 1, wherein the recording is made with a microphone located in the interior of the heating chamber.

3. The method of claim 1, wherein the recording is made with a microphone arranged on an exterior wall of an annealing furnace containing the heating chamber.

4. The method of claim 1, wherein the recording is made with a microphone located between a thermal screen and a door of an annealing furnace allowing access to the heating chamber.

5. The method of claim 1, wherein the recording is made with a microphone located in a tube that opens onto the interior of the heating chamber.

6. The method of claim 1, further recording the sound from the interior or in the vicinity of the heating chamber.

7. The method of claim 1, further comprising recording sound in the interior or in the vicinity of the heating chamber using two microphones located at distance from each other, and, on the basis of a time shift between the sounds of the splitting of a substrate detected in the recording of each of the microphones, locating within the batch the substrate for which splitting has occurred.

8. The method of claim 7, wherein the microphones are located in opposite regions of the heating chamber.

9. The method of claim 1, wherein, after a preset length of time, the number of substrates detected to have split is lower than the number of substrates, and further comprising unloading the batch and separating the split substrates manually.

10. The method of claim 1, wherein a vibration frequency of a substrate during splitting is determined from a maximum frequency of the sound generated by the splitting of the substrate, and a splitting speed of the substrate is determined from the vibration frequency.

11. The method of claim 1, further comprising:
    processing a signal related to the sound to determine a sound intensity; and
    based on the determined sound intensity, computing an energy released during the splitting of a substrate.

12. The method of claim 1, further comprising:
    processing a signal related to the detected acoustic signature to determine a maximum frequency corresponding to a peak sound intensity, and
    based on the determined maximum frequency, computing a speed of a splitting wave propagating through a substrate.

13. The method of claim 1, wherein each substrate comprises at least one semiconductor material.

14. A device for heat treatment of a batch of substrates each comprising a weakened zone formed by implanting atomic species for splitting the substrate along the weakened zone, the device comprising:
- an annealing furnace comprising a heating chamber configured to simultaneously receive the whole of the batch;
- at least one microphone configured to record sounds in the interior or in the vicinity of the heating chamber;
- a processing system configured to detect, in an audio recording produced by the at least one microphone, an acoustic signature emitted when a substrate splits along the weakened zone, to determine that splitting of each substrate along each respective weakened zone has occurred based on the detected acoustic signature, the processing system further configured to determine the number of substrates having split and to compare the number of substrates having split to the number of substrates in the batch; and
- a system for controlling the furnace, the system for controlling the furnace being configured to stop the heat treatment once all the substrates of the batch have been detected to have split.

15. The device of claim 14, wherein the at least one microphone is located in a tube opening into the interior of the heating chamber.

16. The device of claim 14, further comprising at least two microphones located at a distance from one another.

17. The device of claim 16, wherein the processing system is configured, on the basis of a time shift between the sounds of the splitting of a substrate detected in the recording of each of the at least two microphones, to locate within the batch the substrate for which splitting has occurred.

18. The device of claim 14, further comprising a system for controlling the furnace, the system configured to stop the heat treatment once all the substrates of the batch have been detected to have split.

19. A method for monitoring a heat treatment applied to a substrate comprising a weakened zone formed by implanting atomic species with a view to splitting said substrate along said weakened zone, the substrate being arranged in a heating chamber, the method comprising:
- recording sound in the interior or in the vicinity of the heating chamber;
- detecting, in said recording, an acoustic signature emitted by the substrate during the splitting thereof along the weakened zone;
- determining, based on the detected acoustic signature, that a splitting of the substrate along the weakened zone has occurred;
- processing a signal related to the sound to determine a sound intensity; and
- based on the determined sound intensity, computing an energy released during the splitting of a substrate.

20. A method for monitoring a heat treatment applied to a substrate comprising a weakened zone formed by implanting atomic species with a view to splitting said substrate along said weakened zone, the substrate being arranged in a heating chamber, the method comprising:
- recording sound in the interior or in the vicinity of the heating chamber;
- detecting, in said recording, an acoustic signature emitted by the substrate during the splitting thereof along the weakened zone;
- determining, based on the detected acoustic signature, that a splitting of the substrate along the weakened zone has occurred;
- processing a signal related to the detected acoustic signature to determine a maximum frequency corresponding to a peak sound intensity; and
- based on the determined maximum frequency, computing a speed of a splitting wave propagating through a substrate.

* * * * *